(12) United States Patent
Dai et al.

(10) Patent No.: US 11,127,883 B2
(45) Date of Patent: Sep. 21, 2021

(54) SEMICONDUCTOR DEVICE

(71) Applicant: EPISTAR CORPORATION, Hsinchu (TW)

(72) Inventors: Jing-Jie Dai, Hsinchu (TW); Tzu-Chieh Hu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/881,344

(22) Filed: May 22, 2020

(65) Prior Publication Data
US 2020/0287082 A1 Sep. 10, 2020

Related U.S. Application Data

(63) Continuation of application No. 16/182,849, filed on Nov. 7, 2018, now Pat. No. 10,665,750.

(51) Int. Cl.
*H01L 33/14* (2010.01)
*H01L 33/32* (2010.01)
*H01L 33/06* (2010.01)
*H01L 33/30* (2010.01)
*H01L 33/00* (2010.01)
*H01L 33/04* (2010.01)

(52) U.S. Cl.
CPC ........ *H01L 33/145* (2013.01); *H01L 33/0062* (2013.01); *H01L 33/04* (2013.01); *H01L 33/06* (2013.01); *H01L 33/14* (2013.01); *H01L 33/30* (2013.01); *H01L 33/305* (2013.01); *H01L 33/32* (2013.01); *H01L 33/325* (2013.01)

(58) Field of Classification Search
CPC ....... H01L 33/32; H01L 33/325; H01L 33/30; H01L 33/305; H01L 33/14; H01L 33/145; H01L 33/0062; H01L 33/04; H01L 33/06
See application file for complete search history.

(56) References Cited

U.S. PATENT DOCUMENTS

| | | | |
|---|---|---|---|
| 6,046,464 A | 4/2000 | Schetzina | |
| 7,834,343 B2 | 11/2010 | Choi | |
| 10,665,750 B2 * | 5/2020 | Dai | ........................ H01L 33/32 |
| 2002/0195619 A1 | 12/2002 | Makimoto | |
| 2004/0185643 A1 | 9/2004 | Chiyo | |
| 2005/0169333 A1 | 8/2005 | Watanabe | |
| 2007/0290230 A1 * | 12/2007 | Kawaguchi | ............ B82Y 20/00 257/196 |

(Continued)

*Primary Examiner* — Feifei Yeung Lopez

(57) ABSTRACT

A semiconductor device includes: a first semiconductor layer; a second semiconductor layer including a first dopant of a first conductivity type and a second dopant of a second conductivity type, wherein the first dopant has a doping concentration, and the first conductivity type is different from the second conductivity type; a third semiconductor layer on the second semiconductor layer, wherein the third semiconductor layer includes a third dopant including a doping concentration higher than the doping concentration of the first dopant; and an active region between the first semiconductor layer and the second semiconductor layer; wherein the second semiconductor layer includes a bottom surface facing the active region, and the active region includes a top surface facing the second semiconductor layer, and a distance between the bottom surface of the second semiconductor layer and the top surface of the active region is not less than 2 nm.

15 Claims, 3 Drawing Sheets

(56) References Cited

U.S. PATENT DOCUMENTS

| | | |
|---|---|---|
| 2008/0149918 A1 | 6/2008 | Yoo |
| 2009/0078944 A1 | 3/2009 | Kubota |
| 2010/0219395 A1* | 9/2010 | Hirayama ............... H01L 33/06 257/13 |
| 2014/0110720 A1 | 4/2014 | Choi |
| 2014/0131732 A1* | 5/2014 | Fu ......................... H01L 33/002 257/76 |
| 2014/0264265 A1* | 9/2014 | Arena ..................... H01L 33/06 257/13 |
| 2015/0048396 A1 | 2/2015 | Wu |
| 2015/0214422 A1* | 7/2015 | Kim ....................... H01L 33/04 257/13 |
| 2016/0118531 A1* | 4/2016 | Jain ................. H01L 31/035236 257/94 |

* cited by examiner

SEMICONDUCTOR DEVICE

TECHNICAL FIELD

The disclosure relates to a semiconductor device, and particularly to a semiconductor device including a semiconductor layer including two different dopants.

CROSS REFERENCE TO RELATED APPLICATIONS

This application is a continuation application of U.S. application Ser. No. 16/182,849, filed on Nov. 7, 2018, now issued, which claims the benefit of U.S. Provisional Application Ser. No. 62/590,040, filed on Nov. 22, 2017, the entire content of which is hereby incorporated by references.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

A semiconductor device is provided. The semiconductor device includes: a first semiconductor layer; a second semiconductor layer on the first semiconductor layer, wherein the second semiconductor layer includes a first dopant of a first conductivity type and a second dopant of a second conductivity type, wherein the first dopant has a doping concentration, and the first conductivity type is different from the second conductivity type; a third semiconductor layer on the second semiconductor layer, wherein the third semiconductor layer includes a third dopant including a doping concentration higher than the doping concentration of the first dopant; and an active region between the first semiconductor layer and the second semiconductor layer; wherein the second semiconductor layer includes a bottom surface facing the active region, and the active region includes a top surface facing the second semiconductor layer, and a distance between the bottom surface of the second semiconductor layer and the top surface of the active region is not less than 2 nm.

A semiconductor device is provided. The semiconductor device includes: a first semiconductor layer; a second semiconductor layer on the first semiconductor layer, wherein the second semiconductor layer includes a first dopant of a first conductivity type and a second dopant of a second conductivity type, wherein the first conductivity type is different from the second conductivity type, the first dopant has a doping concentration, and the second dopant has a doping concentration; and an active region between the first semiconductor layer and the second semiconductor layer; wherein a ratio of the doping concentration of the first dopant to the doping concentration of the second dopant in the second semiconductor layer is not less than 10.

A semiconductor device is provided. The semiconductor device includes: a first semiconductor layer; a second semiconductor layer on the first semiconductor layer, wherein the second semiconductor layer includes a first dopant of a first conductivity type and a second dopant of a second conductivity type, wherein the first conductivity type is different from the second conductivity type, the first dopant has a doping concentration, and the second dopant has a doping concentration; an active region between the first semiconductor layer and the second semiconductor layer; an Al-containing layer between the active region and the first semiconductor layer, wherein the Al-containing layer includes a dopant including a doping concentration; and a stress releasing structure between the Al-containing layer and the first semiconductor layer, wherein the stress releasing structure includes a dopant including a doping concentration; wherein the doping concentration of the dopant of the stress releasing structure is greater than the doping concentration of the dopant of the Al-containing layer, and the doping concentration of the dopant of the Al-containing layer is greater than the doping concentration of the second dopant of the second semiconductor layer.

A semiconductor device is provided. The semiconductor device includes: a first semiconductor layer; a second semiconductor layer on the first semiconductor layer, wherein the second semiconductor layer includes a first dopant of a first conductivity type; an active region between the first semiconductor layer and the second semiconductor layer; and a confinement layer between the active region and the second semiconductor layer, wherein the confinement layer includes a dopant having a conductivity type different from the first conductivity type.

A semiconductor device is provided. The semiconductor device includes: a first semiconductor layer; a second semiconductor layer on the first semiconductor layer, wherein the second semiconductor layer includes a first dopant of a first conductivity type; an active region between the first semiconductor layer and the second semiconductor layer, wherein the active region includes alternating well layers and barrier layers, one of the barrier layers includes a dopant having a conductivity type different from the first conductivity type, and the dopant of the barrier layer includes a doping concentration; and a confinement layer between the active region and the second semiconductor layer, wherein the confinement layer includes a dopant having a conductivity type different from the first conductivity type, the dopant of the confinement layer includes a doping concentration, and the doping concentration of the dopant of the barrier layer is not less than the doping concentration of the dopant of the confinement layer.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
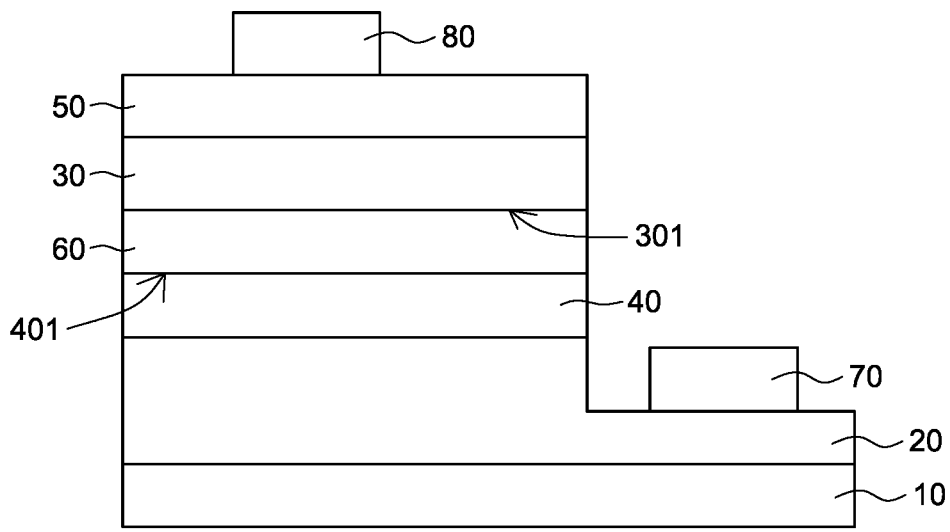
FIG. 1 is a schematic cross-sectional diagram of a first embodiment of a semiconductor device.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaN means $Al_{x1}Ga_{(1-x1)}N$, wherein $0 \le x1 \le 1$; the general expression of InGaN means $In_{x2}Ga_{1-x2}N$, wherein $0 \le x2 \le 1$; the general expression of InAlGaN means $In_{x3}Al_{y1}Ga_{1-x3-y1}N$, wherein $0 \le x3 \le 1$, $0 \le y1 \le 1$. The content of the element can be adjusted for different purposes, such as, but not limited to, adjusting the energy gap or the peak wavelength of the light emitted from the semiconductor device when the semiconductor device includes a light-emitting device.

In the following embodiments, wordings used to indicate directions, such as "up," "down," "front," "back," "left,", "on", 'under' and "right", merely refer to directions in the accompanying drawings. Therefore, the directional wording is used to illustrate rather than limit the present disclosure.

The compositions and dopants of each layer in the semiconductor device of the present disclosure can be determined by any suitable means, such as secondary ion mass spectrometer (SIMS).

The thickness of each layer in the semiconductor device of the present disclosure can be determined by any suitable means, such as transmission electron microscope (TEM) or scanning electron microscope (SEM) to determine the depth position of each layer on the SIMS graph.

The semiconductor device of the present disclosure includes a light-emitting device. The light-emitting device includes a light-emitting diode or a laser.

FIG. 1 is a schematic cross-sectional diagram of a first embodiment of a semiconductor device 1. In the present embodiment, the semiconductor device 1 includes a substrate 10, a first semiconductor layer 20 on the substrate 10, a second semiconductor layer 30 on the first semiconductor layer 20, an active region 40 between the second semiconductor layer 30 and the first semiconductor layer 20, a third semiconductor layer 50 on the second semiconductor layer 30, and a confinement layer 60 between the active region 40 and the second semiconductor layer 30. The semiconductor device 1 further includes a first electrode 70 electrically connected to the first semiconductor layer 20, and a second electrode 80 electrically connected to the third semiconductor layer 50.

The active region 40 includes alternating well layers (not shown) and barrier layers (not shown). Each of the barrier layers has an energy gap. Each of the well layers has an energy gap. In one embodiment, the energy gap of one of the barrier layers is not less than the energy gap of one of the well layers, and preferably, is higher than the energy gap of one of the well layers. Preferably, the energy gap of each of the barrier layers is not less than the energy gap of each of the well layers, and preferably, is higher than the energy gap of each of the well layers. The well layers include Group III-V semiconductor material. In the present embodiment, the well layers include $In_aGa_{1-a}N$, wherein $0 < a \le 1$. In another embodiment, the well layers include $Al_bGa_{1-b}N$, wherein $0 < b \le 1$, and preferably, $0 < b \le 0.4$. The barrier layers include $Al_cGa_{1-c}N$, wherein $0 \le c \le 1$. In one embodiment, $0 < c \le 0.6$. In another embodiment, the barrier layers include GaN. Each of the barrier layers has a thickness greater than the thickness of one of the well layers. Preferably, the thickness of each of the barrier layers is greater than the thickness of each of the well layers. Preferably, the thickness of each of the barrier layers is not greater than 15 nm, and not less than 3 nm. The thickness of each of the well layers is not greater than 5 nm, and not less than 1 nm. A single well layer and a single adjacent barrier layer are regarded as a pair. The pair number of the well layers and the barrier layers is not less than 4, and preferably, not more than 15. The active region 40 includes a top surface 401 facing the confinement layer 60. In one embodiment, the well layer closest to the confinement layer 60 includes the top surface 401.

The second semiconductor layer 30 includes a first dopant of a first conductivity type and a second dopant of a second conductivity type. To improve the emission efficiency, the first conductivity type is different from the second conductivity type. In the present embodiment, the first conductivity type is p-type. The first dopant includes, but not limited to Mg. The second dopant includes, but not limited to Si. The second conductivity type is n-type. The first dopant has a doping concentration, and the second dopant has a doping concentration. In the present embodiment, the doping concentration of the first dopant is greater than the doping concentration of the second dopant of the second semiconductor layer 30. Preferably, to improve the emission efficiency of the semiconductor device 1, a ratio of the doping concentration of the first dopant to the doping concentration of the second dopant of the second semiconductor layer 30 is not less than 10, and preferably, greater than 50, and more preferably, not more than 200. Preferably, the ratio of the doping concentration of the first dopant to the doping concentration of the second dopant of the second semiconductor layer 30 is between 50 and 150 both inclusive. In one embodiment, the doping concentration of the first dopant of the second semiconductor layer 30 is greater than $1 \times 10^{18}/cm^3$, and preferably, greater than $1 \times 10^{19}/cm^3$, and more preferably, not more than $1 \times 10^{21}/cm^3$. In one embodiment, the doping concentration of the second dopant of the second semiconductor layer 30 is greater than $5 \times 10^{16}/cm^3$, and preferably, greater than $1 \times 10^{17}/cm^3$, and more preferably, not more than $5 \times 10^{18}/cm^3$. In one embodiment, the doping concentration of the second dopant of the second semiconductor layer 30 is not more than $1 \times 10^{18}/cm^3$. If the doping concentration of the second dopant is greater than $5 \times 10^{18}/cm^3$, the forward voltage of the semiconductor device 1 will be high, and the emission efficiency and the electrical static discharge (ESD) tolerance of the semiconductor device 1 will be worse.

The second semiconductor layer 30 has an energy gap greater than the energy gap of one of the well layers. Preferably, the energy gap of the second semiconductor layer 30 is greater than the energy gap of each of the well layers. The second semiconductor layer 30 includes $In_dAl_eGa_{(1-d-e)}N$, wherein $0 \le d \le 1$, $0 \le e \le 1$. In the present embodiment, the second semiconductor layer 30 includes GaN. In another embodiment, the second semiconductor layer 30 has an energy gap greater than the energy gap of one of the barrier layers. Preferably, the energy gap of the second semiconductor layer 30 is greater than the energy gap of each of the barrier layers. In one embodiment, $d=0$, $0 < e \le 0.3$. In another embodiment, $0 < d \le 0.1$, $0 \le e \le 0.2$. To improve the emission efficiency, the second semiconductor layer 30 has a thickness between 5 nm and 40 nm both inclusive In the present embodiment, the second semiconductor layer 30 has a bottom surface 301 facing the active region 40. To improve emission efficiency, a distance between the bottom surface 301 of the second semiconductor layer 30 and the top surface 401 of the active region 40 is not less than 2 nm. That is, the second semiconductor layer 30 with the first dopant and the second dopant with different conductivity types is separated from the active region 40, and more preferably, is separated from the last well in the active region 40. The distance between the bottom surface 301 of the second semiconductor layer 30 and the top surface 401 of the active region 40 less than 2 nm will increase leakage current and cause poor electrical static discharge (ESD) tolerance of the semiconductor device 1. In another embodiment, the distance between the bottom surface 301 of the second semiconductor layer 30 and the top surface 401 of the active region 40 is not more than 150 nm, preferably, the distance between the bottom surface 301 of the second semiconductor layer 30 and the top surface 401 of the active region 40 is between 2 nm and 50 nm both inclusive.

In the present embodiment, the confinement layer 60 has an energy gap greater than the energy gap of one of the well layers. Preferably, the energy gap of the confinement layer 60 is greater than the energy gap of each of the well layers. In one embodiment, the confinement layer 60 has a thickness less than the thickness of one of the barrier layers. Preferably, the thickness of the confinement layer 60 is less than the thickness of each of the barrier layers. The thickness of the confinement layer 60 is not less than 2 nm, and preferably, not more than 15 nm. The confinement layer 60 includes $In_fAl_gGa_{(1-f-g)}N$, wherein $0 \le f \le 1$, $0 \le g \le 1$. In another embodiment, the confinement layer 60 includes $Al_hGa_{(1-h)}N$, wherein $0 \le h \le 1$. In one embodiment, the material of the confinement layer 60 is the same as the material of one of the barrier layers. In the present embodiment, the confinement layer 60 includes GaN. In the present embodiment, the confinement layer 60 is unintentionally doped. That is, during the process of forming the confinement layer 60, the amount of a dopant source is substantially 0. The dopant source includes silane ($SiH_4$) or bis-cyclopentadienyl magnesium ($Cp_2Mg$). Furthermore, the dopant of the layer on the confinement layer 60 and adjacent to the confinement layer, which is the dopant of the second semiconductor layer 30 in the present embodiment, may diffuse into the confinement layer. In the present embodiment, Mg, the first dopant of the second semiconductor layer 30 may diffuse into the confinement layer 60. In the present embodiment, the amount of Si of the second semiconductor layer 30 diffusing into the confinement layer 60 is less than the amount of Mg diffusing into the confinement layer 60. Specifically, the doping concentration of Si in the confinement layer 60 is not greater than $5 \times 10^{16}/cm^3$, and more preferably, is not greater than $1 \times 10^{16}/cm^3$.

In another embodiment, the confinement layer 60 is intentionally doped with an n-type dopant. In the present embodiment, the n-type dopant of the confinement layer 60 includes Si. In one embodiment, the doping concentration of the n-type dopant of the confinement layer 60 is greater than $5 \times 10^{16}/cm^3$, and more preferably, is not greater than $5 \times 10^{18}/cm^3$. In one embodiment, the doping concentration of the n-type dopant of the confinement layer 60 is not more than $1 \times 10^{18}/cm^3$. If the doping concentration the n-type dopant of the confinement layer 60 is greater than $5 \times 10^{18}/cm^3$, the forward voltage of the semiconductor device 1 will be high, and the emission efficiency and the ESD tolerance of the semiconductor device 1 will be worse.

The third semiconductor layer 50 includes a third dopant of a third conductivity type. The third conductivity type is the same as the first conductivity type. In the present embodiment, the third conductivity type is p type. In the present embodiment, the third dopant includes, but not limited to, Mg. The third dopant has a doping concentration higher than the doping concentration of the first dopant. The doping concentration of the third dopant of the third semiconductor layer 50 is not less than $1 \times 10^{18}/cm^3$, and preferably, not less than $1 \times 10^{19}/cm^3$, and more preferably, between $1 \times 10^{19}/cm^3$ and $5 \times 10^{22}/cm^3$ both inclusive. The material of the third semiconductor layer 50 includes a Group III-V semiconductor material, such as $Al_iGa_{1-i}N$, wherein $0 \le i \le 1$. In one embodiment, $0 < i < 0.1$, and preferably, $0 < i < 0.05$. If the third semiconductor layer 50 includes Al, the emission efficiency of the semiconductor device 1 will be higher. In another embodiment, the third semiconductor layer 50 includes GaN. The third semiconductor layer 50 has a thickness not more than 15 nm, and preferably, not less than 3 nm.

In another embodiment, at least one of the barrier layers includes an n-type dopant including a doping concentration. The n-type dopant includes, but is not limited to, Si. The doping concentration of the n-type dopant of the barrier layer is greater than the doping concentration of the second dopant of the second semiconductor layer 30. In another embodiment, the doping concentration of the n-type dopant of the barrier layer is not less than the doping concentration of the dopant of the confinement layer 60, and preferably, is greater than the doping concentration of the dopant of the confinement layer 60. If the doping concentration of the n-type dopant of the barrier layer is less than the doping concentration of the dopant of the confinement layer 60, the forward voltage of the semiconductor device 1 will be high, and the emission efficiency and the ESD tolerance of the semiconductor device 1 will be worse. In one embodiment, the doping concentration of the n-type dopant of the barrier layer is not less than $5 \times 10^{16}/cm^3$, and preferably, is greater than $1 \times 10^{17}/cm^3$, and more preferably, is not more than $5 \times 10^{18}/cm^3$. In one embodiment, the doping concentration of the n-type dopant of the barrier layer is not more than $1 \times 10^{18}/cm^3$. If the doping concentration of the n-type dopant of the barrier layers is greater than $5 \times 10^{18}/cm^3$, the emission efficiency of the semiconductor device 1 will be worse.

Figure 2:
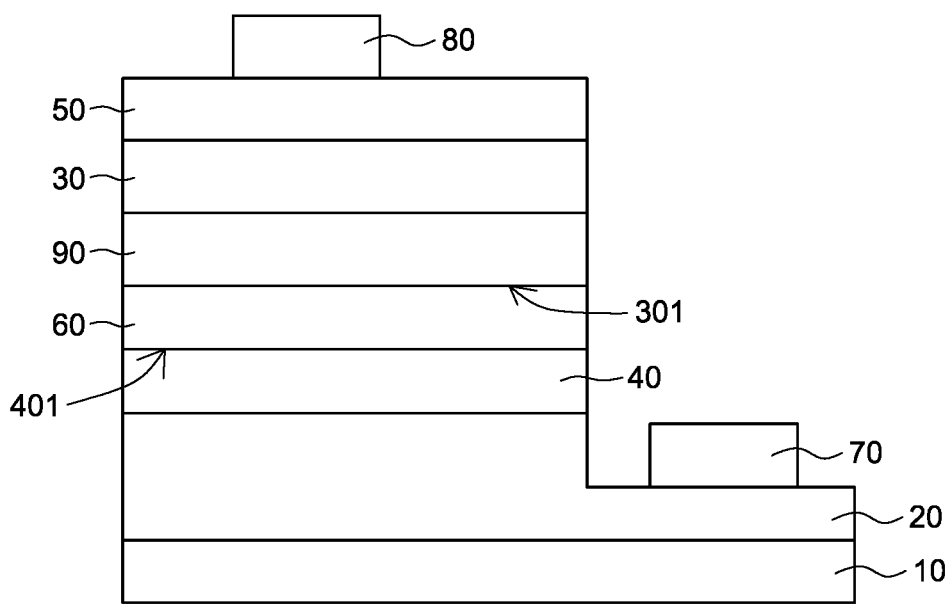
FIG. 2 is a schematic cross-sectional view of a second embodiment of the semiconductor device.

FIG. 2 is a schematic cross-sectional view of a second embodiment of the semiconductor device 2. The semiconductor device 2 in accordance with the second embodiment of the present disclosure includes substantially the same structure as that of the first embodiment. The difference between the first embodiment and the second embodiment is described below. In the present embodiment, the semiconductor device 2 further includes a first Al-containing layer 90 between the confinement layer 60 and the second semiconductor layer 30. The first Al-containing layer 90 has an energy gap greater than both of the energy gap of the confinement layer 60 and the energy gap of the second semiconductor layer 30. In one embodiment, the first Al-containing layer 90 includes a Group III-V semiconductor material, such as $Al_jGa_{1-j}N$, wherein $0 < j \le 1$. In one embodiment, $0 < j \le 0.3$. The first Al-containing layer 90 includes a dopant. The dopant of the first Al-containing layer 90 includes, but not limited to, Mg. Preferably, to improve the emission efficiency, the doping concentration of the dopant of the first Al-containing layer 90 is less than the doping concentration of the first dopant of the second semiconductor layer 30. The doping concentration of the dopant of the first Al-containing layer 90 is not less than $1 \times 10^{18}/cm^3$, and preferably, not less than $5 \times 10^{18}/cm^3$, and more preferably, between $5 \times 10^{18}/cm^3$ and $1 \times 10^{20}/cm^3$ both inclusive. The first Al-containing layer 90 has a thickness between 5 nm and 20 nm both inclusive. If the thickness of the first Al-containing layer 90 is greater than 20 nm, the forward voltage of the semiconductor device 2 will increase.

Figure 3:
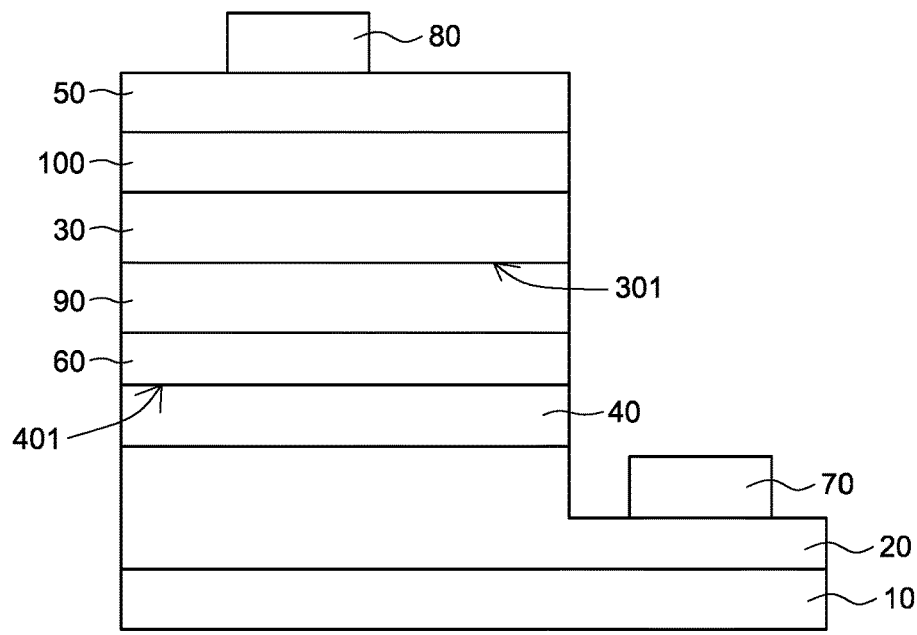
FIG. 3 is a schematic cross-sectional view of a third embodiment of the semiconductor device.

FIG. 3 is a schematic cross-sectional view of a third embodiment of the semiconductor device 3. The semiconductor device 3 in accordance with the third embodiment of the present disclosure includes substantially the same structure as that of the second embodiment. The difference between the second embodiment and the third embodiment is described below. In the present embodiment, the semiconductor device 3 further includes an electron blocking structure 100 between the third semiconductor layer 50 and the second semiconductor layer 30. The electron blocking structure 100 includes an energy gap greater than an energy gap of the second semiconductor layer 30. In the present embodiment, the electron blocking structure 100 includes alternating fourth semiconductor layers (not shown) and fifth semiconductor layers (not shown), wherein the energy gap of one of the fourth semiconductor layers is not less than the energy gap of one of the fifth semiconductor layers. In another embodiment, the energy gap of one of the fourth semiconductor layers is greater than the energy gap of one of the fifth semiconductor layers. Preferably, the energy gap of each of the fourth semiconductor layers is greater than the energy gap of each of the fifth semiconductor layers. In the present embodiment, the energy gap of each of the fourth semiconductor layers is greater than the energy gap of the second semiconductor layer 30. The thickness of one of the fourth semiconductor layers is between 1.5 nm and 5 nm both inclusive. The thickness of one of the fifth semiconductor layers is between 1.5 nm and 5 nm both inclusive. The thickness of the electron blocking structure 100 is between 20 nm and 60 nm both inclusive. One of the fourth semiconductor layers includes $In_kAl_mGa_{1-k-m}N$, wherein $0 \le k \le 1$, $0 \le m \le 1$, preferably, $0 \le k \le 0.005$, $0 \le m \le 0.5$, One of the fifth semiconductor layers includes $In_nAl_pGa_{1-n-p}N$, wherein $0 \le n \le 1$, $0 \le p \le 1$, and preferably, $p<m$. A single fourth semiconductor layer and a single adjacent fifth semiconductor layer are regarded as a pair. The number of the pair is between 5 and 10 both inclusive. In the present embodiment, the materials of the fourth semiconductor layers are substantially the same. The materials of the fifth semiconductor layers are substantially the same. The alternating fourth semiconductor layers and fifth semiconductor layers further improves the emission efficiency of the semiconductor device 3. In one embodiment, the electron blocking structure 100 has a dopant the same as the first dopant. In one embodiment, the doping concentration of the dopant of the electron blocking structure 100 is greater than the doping concentration of the dopant of the first Al-containing layer 90. The doping concentration of the dopant of the electron blocking structure 100 is greater than $1 \times 10^{18}/cm^3$, and preferably, greater than $1 \times 10^{19}/cm^3$, and more preferably, not more than $1 \times 10^{21}/cm^3$.

In another embodiment, the electron blocking structure 100 is composed of a single fourth semiconductor layer with a thickness between 20 nm and 60 nm both inclusive.

Figure 4:
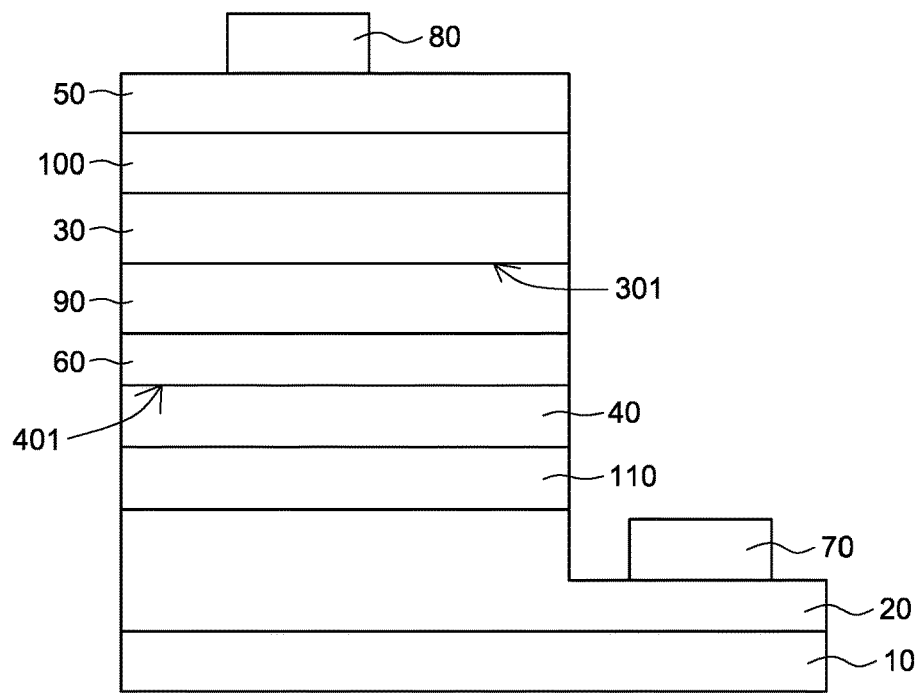
FIG. 4 is a schematic cross-sectional view of a fourth embodiment of the semiconductor device.

FIG. 4 is a schematic cross-sectional view of a fourth embodiment of the semiconductor device 4. The semiconductor device 4 in accordance with the fourth embodiment of the present disclosure includes substantially the same structure as that of the third embodiment. The difference between the fourth embodiment and the third embodiment is described below. In the present embodiment, the semiconductor device 4 further includes a second Al-containing layer 110 between the active region 40 and the first semiconductor layer 20. That is, the first Al-containing layer 90 and the second Al-containing layer 110 are on two opposite sides of the active region 40. The second Al-containing layer 110 has an energy gap greater than the energy gap of one of the barrier layers. Preferably, the energy gap of the second Al-containing layer 110 is greater than the energy gap of each of the barrier layers. In the present embodiment, the energy gap of the second Al-containing layer 110 is greater than the energy gap of the confinement layer 60. The energy gap of the second Al-containing layer 110 is less than the energy gap of the first Al-containing layer 90. In one embodiment, when the electron blocking structure 100 includes alternating fourth semiconductor layers and fifth semiconductor layers, the energy gap of the second Al-containing layer 110 is less than the energy gap of one of the fourth semiconductor layers. In the present embodiment, the energy gap of the second Al-containing layer 110 is less than the energy gap of each of the fourth semiconductor layers. In one embodiment, the second Al-containing layer 110 includes $Al_qGa_{1-q}N$, wherein $0<q \le 1$, and preferably, $q<j$, wherein the first Al-containing layer 90 includes $Al_jGa_{1-j}N$. Preferably, $0<q \le 0.05$. In one embodiment, the second Al-containing layer 110 includes an n-type dopant including a doping concentration. In the present embodiment, the n-type dopant of the second Al-containing layer 110 includes Si. In one embodiment, the doping concentration of the n-type dopant of the second Al-containing layer 110 is not less than the doping concentration of the n-type dopant of the confinement layer 60. Preferably, the doping concentration of the n-type dopant of the second Al-containing layer 110 is greater than the doping concentration of the n-type dopant of the confinement layer 60. In one embodiment, the doping concentration of the n-type dopant of the second Al-containing layer 110 is not less than the doping concentration of the second dopant of the second semiconductor layer 30. Preferably, the doping concentration of the n-type dopant of the second Al-containing layer 110 is greater than the doping concentration of the second dopant of the second semiconductor layer 30. In one embodiment, the doping concentration of the n-type dopant of the second Al-containing layer 110 is not less than $5 \times 10^{16}/cm^3$, and preferably, not less than $1 \times 10^{17}/cm^3$, and more preferably, not more than $5 \times 10^{18}/cm^3$. In one embodiment, the doping concentration of the n-type dopant of the second Al-containing layer 110 is not more than $1 \times 10^{18}/cm^3$.

Figure 5:
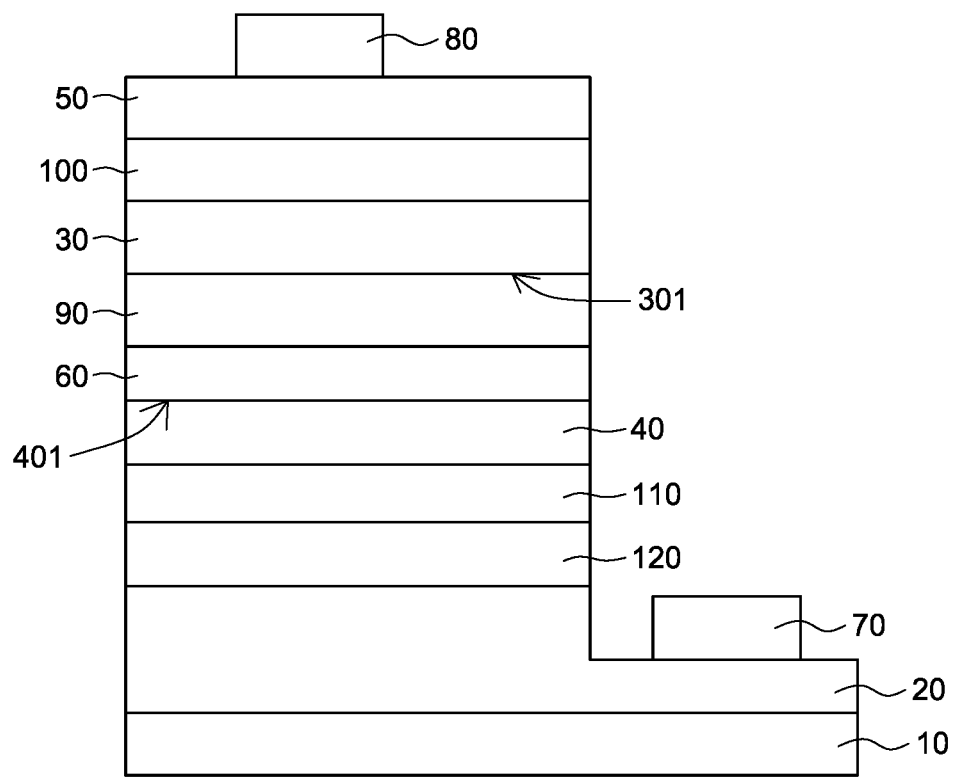
FIG. 5 is a schematic cross-sectional view of a fifth embodiment of the semiconductor device.

FIG. 5 is a schematic cross-sectional view of a fifth embodiment of the semiconductor device 5. The semiconductor device 5 in accordance with the fifth embodiment of the present disclosure includes substantially the same structure as that of the fourth embodiment. The difference between the fifth embodiment and the fourth embodiment is described below. In the present embodiment, the semiconductor device 5 further includes a stress releasing structure 120 between the second Al-containing layer 110 and the first semiconductor layer 20. The stress releasing structure 120 includes alternating sixth semiconductor layers (not shown) and seventh semiconductor layers (not shown), wherein a single sixth semiconductor layer and a single adjacent seventh semiconductor layer are considered as a pair. The sixth semiconductor layers and the seventh semiconductor layers include Group III-V semiconductor material. The energy gap of the sixth semiconductor layers is greater than the energy gap of the seventh semiconductor layer in a pair. The sixth semiconductor layers include $In_rAl_sGa_{1-r-s}N$, wherein $0 \le r \le 1$, $0 \le s \le 1$. The seventh semiconductor layers include $In_tGa_{1-t}N$, wherein $0 < t \le 1$. In one embodiment, the sixth semiconductor layers include GaN. The number of the pairs of the sixth semiconductor layers and the seventh semiconductor layers is not less than 3, and preferably, is not greater than 40. The thickness of one of the sixth semiconductor layers is greater than the thickness of one of the seventh semiconductor layers. Preferably, the thickness of each of the sixth semiconductor layers is greater than the thickness of each of the seventh semiconductor layers. In one embodiment, the thickness of one of the sixth semiconductor layers is not less than 5 nm, and preferably, is not more than 80 nm. In one embodiment, to further reduce the forward voltage of the semiconductor device 5, the thickness of one of the sixth semiconductor layers is between 60 nm and 80 nm both inclusive. The thickness of one of the seventh semiconductor layers is not less than 1 nm, and preferably, is not more than 10 nm. In one embodiment, one of the sixth semiconductor layers includes an n-type dopant including a doping concentration. In the present embodiment, the n-type dopant of the sixth semiconductor layer includes Si. In one embodiment, the doping concentration of the n-type dopant of the sixth semiconductor layer is greater than the doping concentration of the n-type dopant of the second Al-containing layer 110. In one embodiment, a ratio of the doping concentration of the n-type dopant of the sixth semiconductor layer to the doping concentration of the n-type dopant of the second Al-containing layer 110 is not less than 2, and preferably, is not greater than 10. In one embodiment, the doping concentration of the n-type dopant of the sixth semiconductor layer is not less than $5\times10^{17}/cm^3$, and preferably, not less than $1\times10^{18}/cm^3$, and more preferably, not more than $1\times10^{19}/cm^3$. In one embodiment, the seventh semiconductor layers are undoped or unintentionally doped.

In the present disclosure, the first semiconductor layer 20 of any one of the embodiments of the semiconductor device may include $Al_qGa_{1-q}N$, wherein $0\leq q\leq 1$. Preferably, the first semiconductor layer 20 includes GaN and an n-type dopant. The first semiconductor layer 20 has a thickness not less than 100 nm, and preferably not more than 3000 nm. The doping concentration of the n-type dopant of the first semiconductor layer 20 is greater than the doping concentration of the n-type dopant of the sixth semiconductor layer. The doping concentration of the n-type dopant of the first semiconductor layer 20 is not less than $1\times10^{18}/cm^3$, and preferably, not less than $5\times10^{18}/cm^3$, and more preferably, between $5\times10^{18}/cm^3/cm^3$ and $5\times10^{21}/cm^3$ both inclusive. The n-type dopant includes, but is not limited to, Si.

In the present disclosure, any one of the embodiments of the semiconductor device may further include a buffer layer (not shown) between the substrate 10 and the first semiconductor layer 20. The buffer layer is for reducing dislocations and improving quality of the layers formed by epitaxial growth thereon. In one embodiment, the buffer layer includes $Al_iGa_{1-i}N$, wherein $0\leq i\leq 1$. In one embodiment, the buffer layer includes GaN. In another embodiment, the buffer layer 20 includes AlN. The buffer layer may be formed by physical vapor deposition (PVD) or epitaxy. The PVD includes sputtering or E-gun evaporation.

In the present disclosure, the substrate 10 of any one of the embodiments of the semiconductor device has a thickness thick enough for supporting the layers or structures thereon, for example, not less than 50 μm, and more preferably, not more than 300 μm. In one embodiment, the substrate 10 includes sapphire with protrusions periodically formed on a surface thereof. In another embodiment, the substrate 10 includes conductive material including Si, Ge, Cu, Mo, MoW, GaN, ZnO or CuW.

In the present disclosure, the first electrode 70 and the second electrode 80 of any one of the embodiments of the semiconductor device are for electrically connecting to an external power source and for conducting a current therebetween. The material of the first electrode 70 and the second electrode 80 include transparent conductive material or metal material, wherein the transparent conductive material includes transparent conductive oxide including indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material includes Au, Pt, GeAuNi, Ti, BeAu, GeAu, Al, or ZnAu, Ni.

In one embodiment, the first electrode 70 and the second electrode 80 may be on the two opposite sides of the substrate 10 respectively. In the present embodiment, the substrate 10 may include conductive material.

The method of performing epitaxial growth includes, but is not limited to, metal-organic chemical vapor deposition (MOCVD), hydride vapor phase epitaxy (HYPE), molecular beam epitaxy (MBE), or liquid-phase epitaxy (LPE). Preferably, the method includes MOCVD.

When any one of the embodiments of the semiconductor device of the present disclosure includes a light emitting device, the peak wavelength of the light emitted from the light emitting device is in a visible or invisible range, and preferably, in a blue or ultraviolet range. Preferably, the peak wavelength is between 250 nm and 570 nm both inclusive, and preferably, between 350 nm and 480 nm both inclusive.

In accordance with a further embodiment of the present disclosure, the structures in the embodiments of the present disclosure can be combined or changed. For example, the semiconductor device 1 as shown in FIG. 1 includes the second Al-containing layer 110 as shown in FIG. 4.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
   a first semiconductor layer;
   a second semiconductor layer on the first semiconductor layer, wherein the second semiconductor layer comprises a first dopant of a first conductivity type and a second dopant of a second conductivity type, wherein the first dopant has a doping concentration, and the first conductivity type is different from the second conductivity type;
   an active region between the first semiconductor layer and the second semiconductor layer, wherein the active region comprises multiple well layers and multiple barrier layers, and comprises a third dopant comprising a doping concentration;
   a confinement layer between the active region and the second semiconductor layer; wherein the confinement layer comprises a fourth dopant comprising a doping concentration and a conductivity type different from the first conductivity type; and
   a first Al-containing layer between the confinement layer and the second semiconductor layer, wherein the first Al-containing layer comprises an energy gap greater than an energy gap of the confinement layer;

wherein the doping concentration of the third dopant of the active region is greater than the doping concentration of the fourth dopant of the confinement layer, wherein the doping concentration of the fourth dopant of the confinement layer is not more than $1\times10^{18}/cm^3$, wherein the material of the confinement layer is the same as the material of one of the barrier layers.

2. The semiconductor device according to claim 1, further comprising a third semiconductor layer on the second semiconductor layer, wherein the third semiconductor layer comprises a fifth dopant comprising a doping concentration higher than the doping concentration of the first dopant.

3. The semiconductor device according to claim 1, wherein the second dopant includes a doping concentration, and the doping concentration of the first dopant is greater than the doping concentration of the second dopant of the second semiconductor layer.

4. The semiconductor device according to claim 1, wherein the semiconductor device further comprises an electron blocking structure on the second semiconductor layer, and the electron blocking structure includes an energy gap greater than an energy gap of the second semiconductor layer.

5. The semiconductor device according to claim 4, wherein the electron blocking structure comprises a dopant comprising a doping concentration, and the doping concentration of the second dopant is less than the doping concentration of the dopant of the electron blocking structure.

6. The semiconductor device according to claim 1, wherein the dopant of the active region comprises a conductivity type different from the first conductivity type.

7. The semiconductor device according to claim 1, wherein the doping concentration of the first dopant of the second semiconductor layer is not less than $1\times10^{18}/cm^3$.

8. The semiconductor device according to claim 1, wherein the second dopant of the second semiconductor layer has a doping concentration not less than $1\times10^{17}/cm^3$.

9. The semiconductor device according to claim 1, wherein the doping concentration of the second dopant of the second semiconductor layer is not more than $5\times10^{18}/cm^3$.

10. The semiconductor device according to claim 1, wherein the second semiconductor layer has a thickness between 5 nm and 30 nm both inclusive.

11. The semiconductor device according to claim 1, further comprising a second Al-containing layer between the first semiconductor layer and the active region.

12. A semiconductor device comprising:
a first semiconductor layer;
a second semiconductor layer on the first semiconductor layer, wherein the second semiconductor layer comprises a first dopant of a first conductivity type;
an active region between the first semiconductor layer and the second semiconductor layer, and the active region comprises multiple well layers and multiple barrier layers;
a confinement layer between the active region and the second semiconductor layer, wherein the confinement layer comprises a second dopant comprising a doping concentration and a conductivity type different from the first conductivity type;
a first Al-containing layer between the confinement layer and the second semiconductor layer, wherein the first Al-containing layer has a higher energy gap than the energy gap of the confinement layer;
a third semiconductor layer formed on the second semiconductor layer; and
an electron blocking structure between the second semiconductor layer and the third semiconductor layer, wherein the electron blocking structure comprises a higher energy gap than the second semiconductor layer;
wherein the first Al-containing layer comprises a fourth dopant comprising a doping concentration, and the doping concentration of the fourth dopant is greater than the doping concentration of the second dopant;
wherein the material of the confinement layer comprises higher In content than the material of one of the barrier layers of the active region.

13. The semiconductor device according to claim 12, wherein the confinement comprises a third dopant comprising a conductivity type, and the conductivity type of the second dopant is different from the conductivity type of the third dopant.

14. The semiconductor device according to claim 12, wherein the third semiconductor comprises a fifth dopant comprising a doping concentration higher than the doping concentration of the first dopant.

15. The semiconductor device according to claim 12, wherein the thickness of the confinement layer is less than the thickness of each of the barrier layers.

* * * * *